United States Patent
Sun

(10) Patent No.: US 6,844,766 B2
(45) Date of Patent: Jan. 18, 2005

(54) VCDL WITH LINEAR DELAY CHARACTERISTICS AND DIFFERENTIAL DUTY-CYCLE CORRECTION

(75) Inventor: Jing Sun, Singapore (SG)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/401,979

(22) Filed: Mar. 28, 2003

(65) Prior Publication Data

US 2004/0189367 A1 Sep. 30, 2004

(51) Int. Cl.⁷ .............................................. H03H 11/26
(52) U.S. Cl. ..................................... 327/284; 327/158
(58) Field of Search ................................ 327/149, 153, 327/158, 161, 175, 261, 266, 276–280, 284, 287; 375/373; 331/57

(56) References Cited

U.S. PATENT DOCUMENTS

| | | | |
|---|---|---|---|
| 5,012,142 A | * | 4/1991 | Sonntag ....................... 327/281 |
| 5,231,320 A | * | 7/1993 | Kase ............................ 327/277 |
| 5,559,476 A | * | 9/1996 | Zhang et al. ................... 331/57 |
| 5,757,873 A | * | 5/1998 | Hunt ............................ 375/373 |
| 6,081,146 A | * | 6/2000 | Shiochi et al. ............... 327/277 |
| 6,411,145 B1 | | 6/2002 | Kueng et al. ................ 327/175 |
| 6,703,879 B2 | * | 3/2004 | Okuda et al. ............... 327/158 |

OTHER PUBLICATIONS

CMOS Low–Voltage Rail–To–Rail V–I Convertor, Chung–Chih Hung, Changku Hwang, and Mohammed Ismail, 1999 IEEE, pp. 1337 through 1340.

An Integrated High Resolution CMOS Timing Generator Based On An Array of Delay Locked Loops, Jorgen Christiansen, 1996 IEEE.

* cited by examiner

*Primary Examiner*—Minh Nguyen
(74) *Attorney, Agent, or Firm*—Lerner, David, Littenberg, Krumholz & Mentlik, LLP

(57) ABSTRACT

A voltage-controlled delay line (VCDL) comprises a series of delay cells outputting a clock output signal having a delay relative to a clock input signal input to the series of delay cells. A duty-cycle correction section corrects the duty cycle of the clock output signal by providing opposite current outputs which are fed back to the series of delay cells to substantially simultaneously charge and discharge current of the series of delay cells in opposite directions. A control current input to the series of delay cells controls the amount of the delay. A voltage-to-current converter converts a control voltage into the control current so that the delay changes substantially linearly as the control voltage changes. The method for using the VCDL to produce linear delay is also included. The VCDL can be used in a delay-locked loop (DLL).

13 Claims, 7 Drawing Sheets

Transient Response

ı : delay(VT("/Vinp") 0.75 4 "fal-: delay(VT("/Vinp") 0.75 4 "ris
-: delay(VT("/Vinp") 0.75 4 "fal ı: delay(VT("/Vinp") 0.75 4 "ris -: delay(VT("/Vinp") 0.75 4 "fal ı: delay(VT("/Vinp") 0.75 4 "nt
ı : delay(VT("/Vinp") 0.75 4 "fal-: delay(VT("/Vinp") 0.75 4 "fa

US 6,844,766 B2

VCDL WITH LINEAR DELAY CHARACTERISTICS AND DIFFERENTIAL DUTY-CYCLE CORRECTION

FIELD OF THE INVENTION

The present invention relates to a Voltage-Controlled Delay Line (VCDL) and more particularly to a VCDL for use in a Delay Locked Loop (DLL).

BACKGROUND OF THE INVENTION

DLLs have been widely used for clock alignment in electronics systems. A VCDL is the key part of a DLL. In a DLL, variation of the loop gain can be caused by variation in VCDL gain, thus causing the loop bandwidth of the DLL to vary from the design target. The variations in the VCDL gain can result from VCDL nonlinear delay characteristics. Thus it is important that the VCDL has a linear delay characteristic over the full range of the control voltage. It is also desirable for a VCDL to have good duty cycle correction.

VCDLs are often implemented using current starved inverters. Different starving currents generate different delay times. However, the simple configuration of conventional current starved inverters results in very nonlinear delay characteristics. One method to solve this problem is disclosed in the reference to Christiansen (Jorgen Christiansen, "An Integrated High Resolution CMOS Timing Generator Based on an Array of Delay Locked Loops", IEEE Journal of Solid-State Circuits, Vol. 31, No. 7, July 1996). In the Christiansen reference, parallel connected input stages are added to the current starved inverters to get linear controllability. However, this method fails to achieve a linear delay characteristic over the full range of the control voltage.

Another method to reduce the effect of the variation of the VCDL gain on the DLL loop gain has been proposed by applying a self-biasing technique as disclosed in the reference to Maneatis (John G. Maneatis, "Low-Jitter Process-Independent DLL and PLL Based on Self-Biased Techniques", IEEE Journal of Solid-State Circuits, Vol. 31, No. 11, November 1996). The current dependence of VCDL gain can be cancelled out, leading to loop bandwidth that tracks operating frequency. But this solution requires a complex DLL system design.

It would be desirable to have a VCDL with a linear delay characteristic over the full range of the control voltage. It would also desirable for the VCDL to have good duty cycle correction.

SUMMARY OF THE INVENTION

The present invention provides a VCDL with a relatively linear delay characteristic over the full range of the control voltage by forming the VCDL from a voltage-to-current converter in combination with a CCDL (Current Controlled Delay Line). In addition, the duty cycle correction of the resulting VCDL is improved using another voltage-to-current converter.

In general terms, the present invention is a voltage-controlled delay line comprising a series of delay cells outputting a clock output signal having a delay relative to a clock input signal input to the series of delay cells. A duty-cycle correction section corrects the duty cycle of the clock output signal by providing opposite current outputs which are fed back to the series of delay cells to substantially simultaneously charge and discharge current of the series of delay cells in opposite directions. A control current input to the series of delay cells controls the amount of the delay. A voltage-to-current converter converts a control voltage into the control current so that the delay changes substantially linearly as the control voltage changes.

The present invention also includes the method for providing linear delay relative to the control voltage. A DLL using the inventive VCDL is also included.

BRIEF DESCRIPTION OF THE FIGURES

Further preferred features of the invention will now be described for the sake of example only with reference to the following figures, in which.

DETAILED DESCRIPTION OF THE EMBODIMENTS

The present invention, rather than using a conventional VCDL to implement a DLL, uses a CCDL supplied by a rail-to-rail voltage-to-current converter, the two blocks together forming a VCDL having a linear delay characteristic. The resulting VCDL has a linear delay characteristic over substantially the entire range of the supply voltage of the VCDL and has a large delay range.

The present invention also includes another rail-to-rail voltage-to-current converter having differential output currents. This second converter provides improved duty cycle correction.

Figure 1:
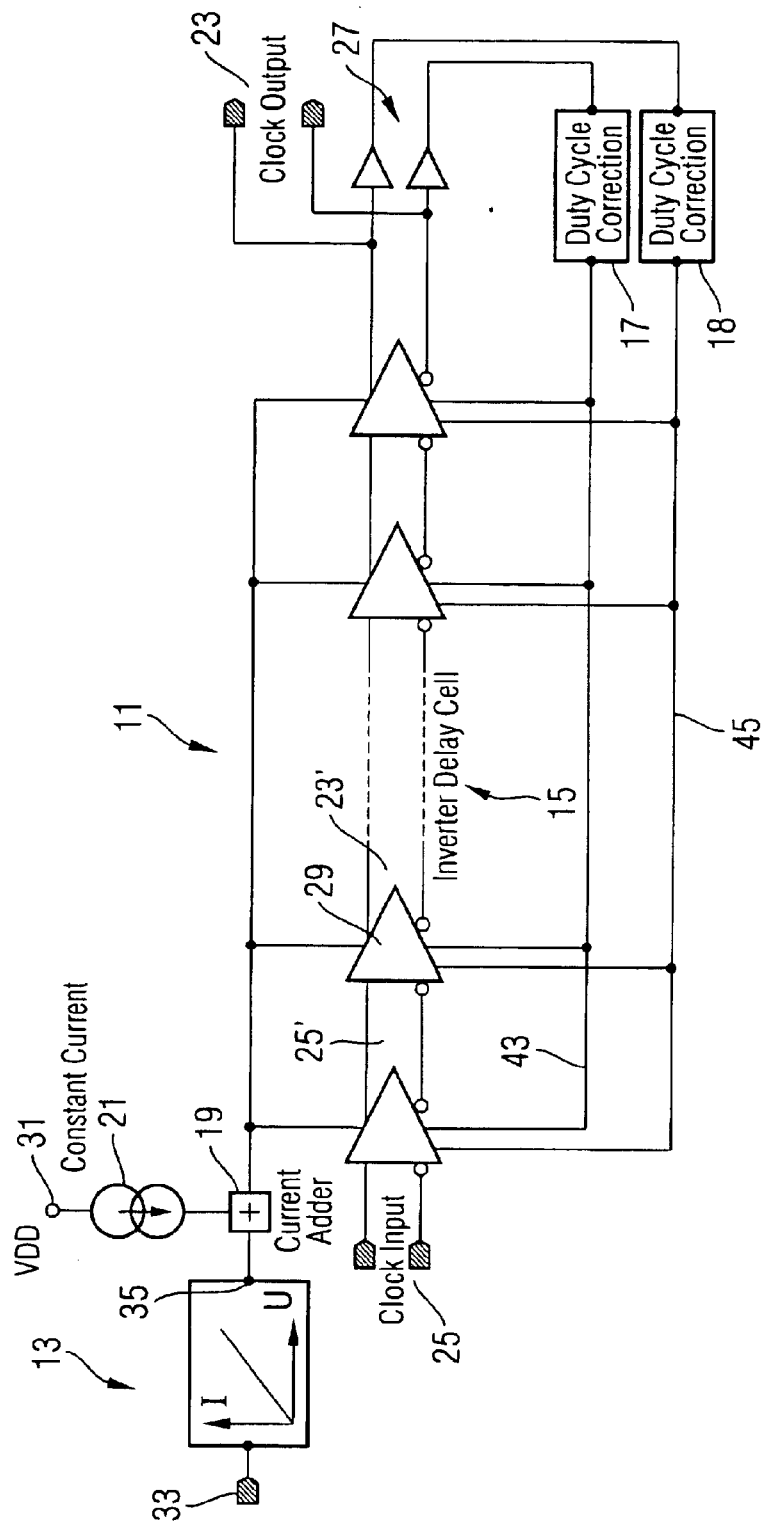
FIG. 1 shows a block diagram of the VCDL of the present invention.

FIG. 1 shows a block diagram of the VCDL 11 of the present invention. The VCDL 11 of the present invention produces a differential clock output voltage 23 having a delay relative to a differential clock input voltage 25 which is a substantially linear function of a control voltage $V_{control}$ 33. A rail-to-rail voltage-to-current converter 13 converts the control voltage $V_{control}$ 33 into a control current $I_{control}$ 35 and supplies the control current $I_{control}$ 35 to a series of differential inverter delay cells 15. Each of the differential inverter delay cells has two clock inputs and two clock outputs for receiving and outputting clock signal voltages. A current adder 19 is supplied by a constant current 21 to add enough biasing current to the control current $I_{control}$ 35 to assure the supply of at least the minimum amount of current needed to drive the inverter delay cells 15. The differential clock input 25 can come from an external crystal generator, for example. The delay introduced by the inverter delay cells 15 is controlled by the amount of current supplied to the inverter delay cells 15 by the voltage-to-current converter 13 through the current adder 19.

A buffer 27 is also provided to separate two substantially identical duty cycle correction circuits 17, 18 from the clock output 23.

The duty cycle correction circuits 17, 18 sample the clock output 23 through the buffer 27 and provide feedback through first and second buses 43 and 45 to the inverter delay cells 15 for duty cycle correction.

The voltage-to-current converter 13, and also the inverter delay cells 15, duty correction circuit 17, and constant current source 21 can all be supplied by a direct supply voltage VDD 31.

The inverter delay cells 15 have substantially linear delay characteristics over a certain range of the control current $I_{control}$ 35 provided by the voltage-to-current converter 13. Therefore, if the voltage-to-current converter 13 can output a current within that certain range while the control voltage $V_{control}$ 33 varies over the full range of 0 to VDD volts (rail-to-rail between 0 volts and VDD volts), then the differential clock output voltage 23 will have a delay relative to the differential clock input voltage 25 which is a substantially linear function of the control voltage $V_{control}$ 33 (the delay will be linear from rail-to-rail).

Figure 2:
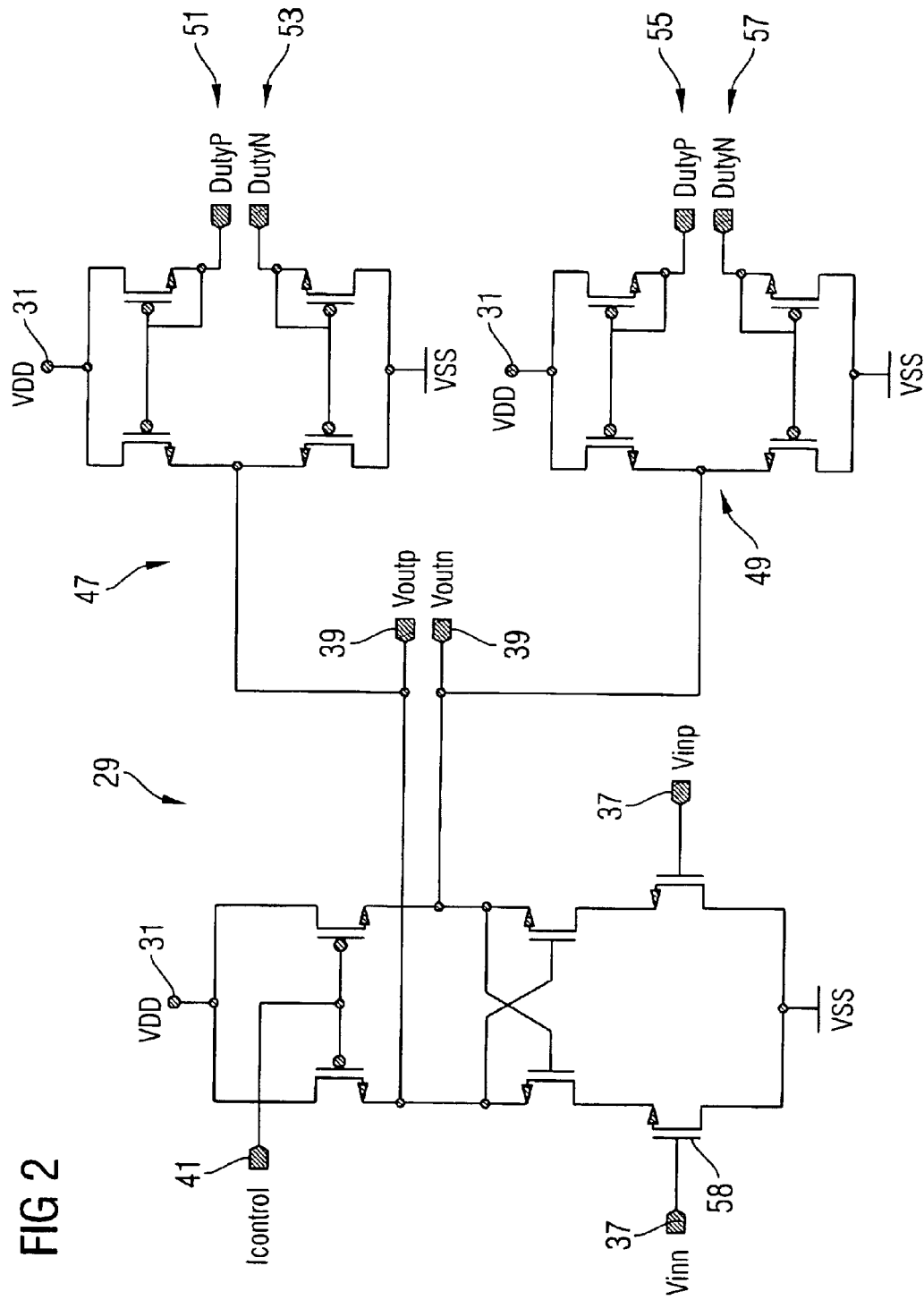
FIG. 2 is a schematic view of one of the inverter delay cells of FIG. 1.

One inverter delay cell 29 from the series of differential inverter delay cells 15 is shown in FIG. 2 and is additionally described in relation to reference numbers of FIG. 1. The individual inverter delay cells from the series of cells 15 can be substantially identical, with the clock output of one inverter delay cell supplying the clock input of a following inverter delay cell as shown in FIG. 1. A differential clock input voltage 25' is supplied to the clock inputs 37. A differential clock output voltage 23' is output from the clock outputs 39. The control current $I_{control}$ 35 is input to the control current input 41.

A first current mirror 47 receives positive and negative duty cycle correction signals DutyP 51 and DutyN 53 on the first bus 43 and a second current mirror 49 receives positive and negative duty cycle correction signals DutyP 55 and DutyN 57 on the second bus 45. These duty cycle correction signals provide feedback to correct the duty cycle of the VCDL 11 clock output voltage 23.

The inverter delay cell 29 is shown to have a total of 14 MOSFETs 58 including 8 MOSFETs forming the current mirrors 47, 49.

Figure 3:
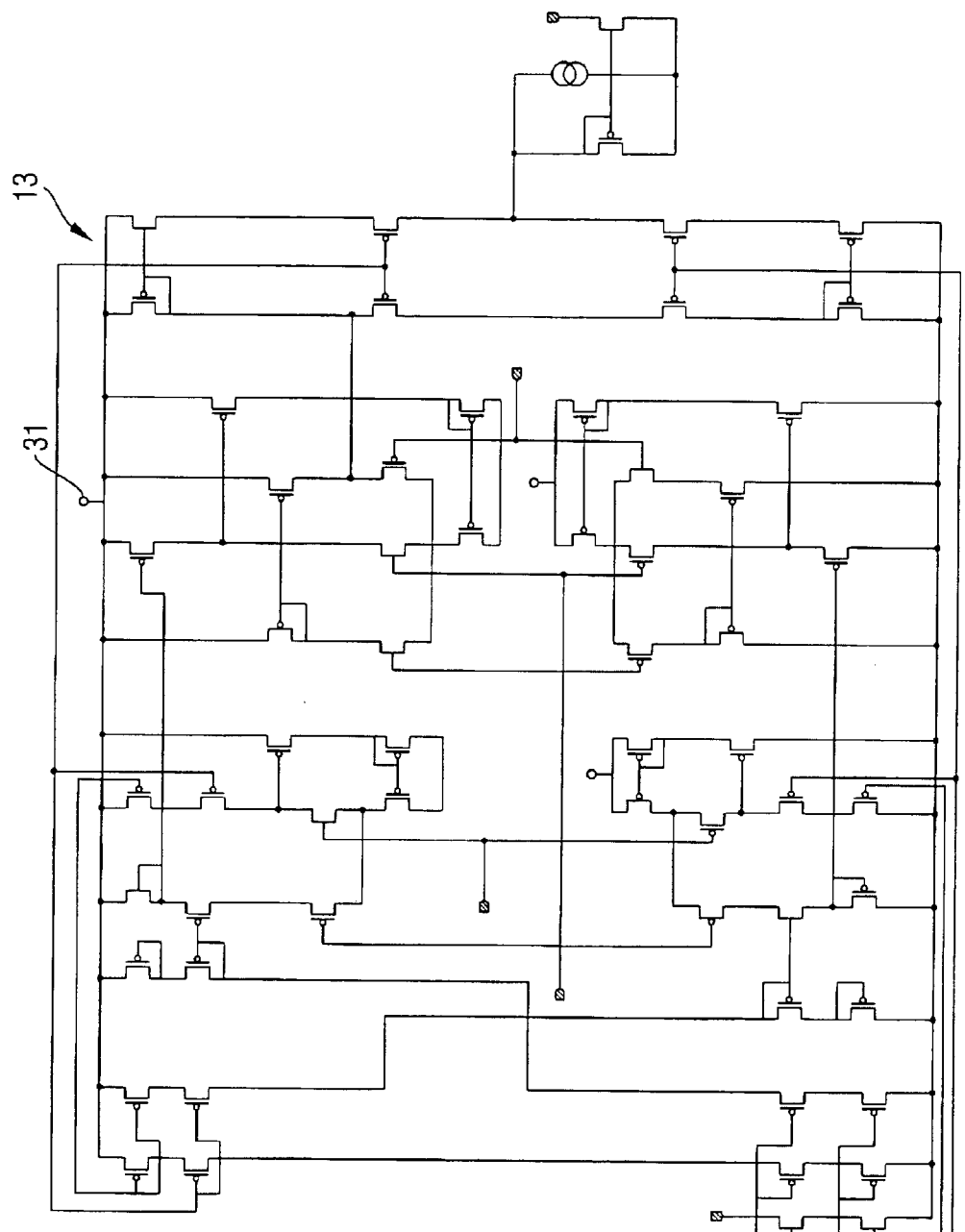
FIG. 3 is a more detailed schematic view of the voltage-to-current converter of FIG. 1.

FIG. 3 shows the voltage-to-current converter 13 of FIG. 1 in more detail. The rail-to-rail voltage-to-current converter proposed by Hung et al. (Chung-Chih Hung et al., "CMOS Low-Voltage Rail-to-Rail V-I Converter", Circuits and Systems, 1995, Proceedings, Proceedings of the 38th Midwest Symposium, vol. 2, 1996, pages 1337–1340) has been adopted to implement this circuit. By summing the output current of this voltage-to-current converter to a constant current, the required current range is achieved for the linear CCDL of the present invention. Other voltage-to-current converter designs can also be used in the present invention.

Figure 4:
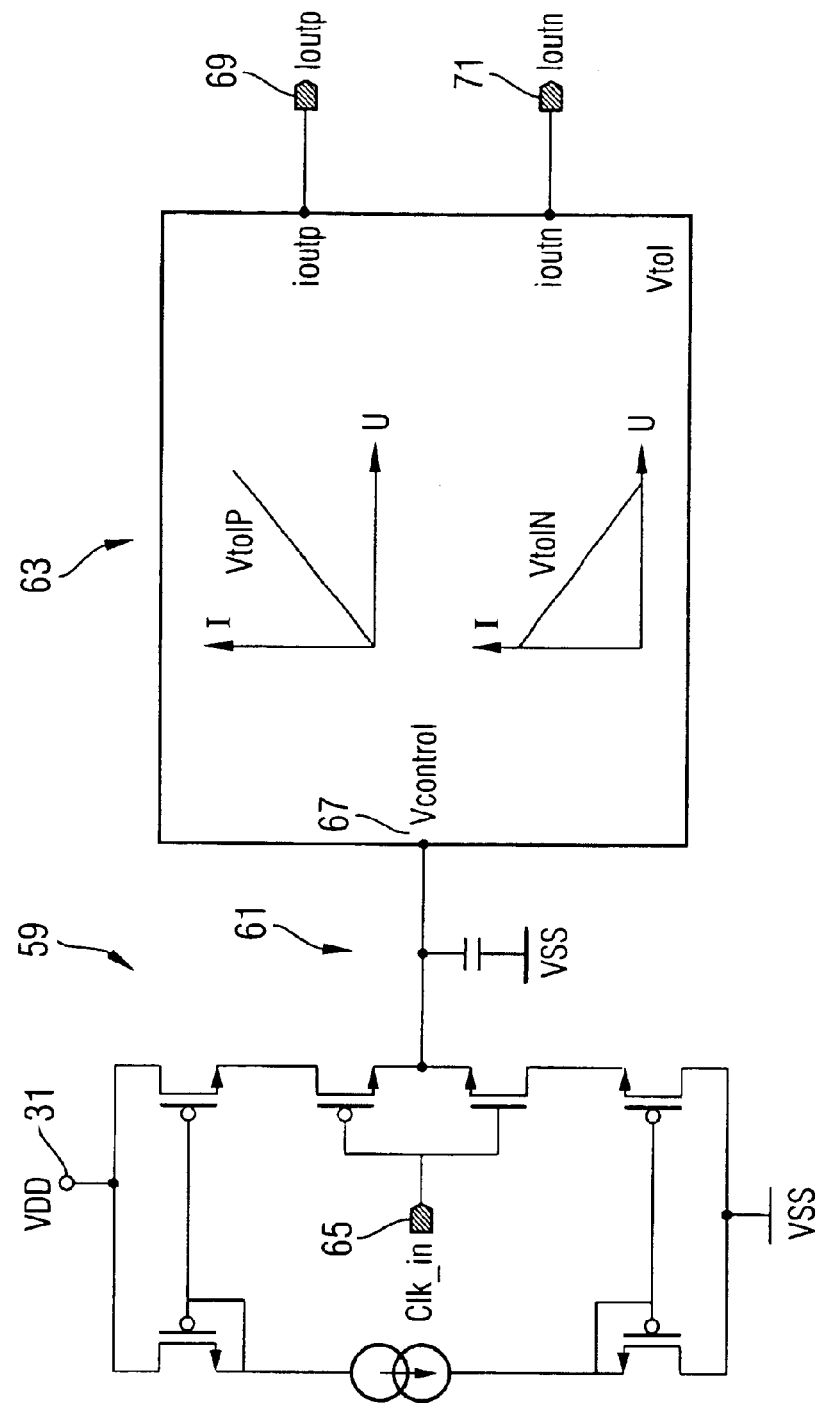
FIG. 4 illustrates in more detail one of the duty cycle correction circuits of FIG. 1.

The duty cycle correction circuits 17, 18 are described in more detail with respect to FIG. 4. Each of the duty cycle correction circuits 17, 18 includes a charge pump 59, a low pass filter 61 and a voltage-to-current converter 63 with differential output currents. The charge pump 59 samples one of the outputs forming the differential clock output voltage 23 at an input 65 and converts the voltage into a control voltage 67 which is then passed through the low pass filter 61 to the voltage-to-current converter 63. The voltage-to-current converter 63 converts the control voltage 67 into differential output currents 69, 71. As can be seen from FIG. 4, one of the current outputs increases with increasing voltage while the other decreases with increasing voltage.

The differential output currents 69, 71 of the duty cycle correction circuit 17 are the positive and negative duty cycle correction signals DutyP 51 and DutyN 53 fed-back to the current mirror 47 on the first bus 43 (the differential output currents 69, 71 of the duty cycle correction circuit 17 sink and source to the current mirror 47). The differential output currents 69, 71 of the duty cycle correction circuit 18 also serve as the positive and negative duty cycle correction signals DutyP 55 and DutyN 57 fed-back to the current mirror 49 on the second bus 45 (the differential output currents 69, 71 of the duty cycle correction circuit 18 sink and source to the current mirror 49). The oppositely increasing and decreasing output currents 69, 71 serve to simultaneously adjust the charge and discharge current of the delay cells 15 in opposite directions and thereby speed up duty cycle correction.

Figure 5A:
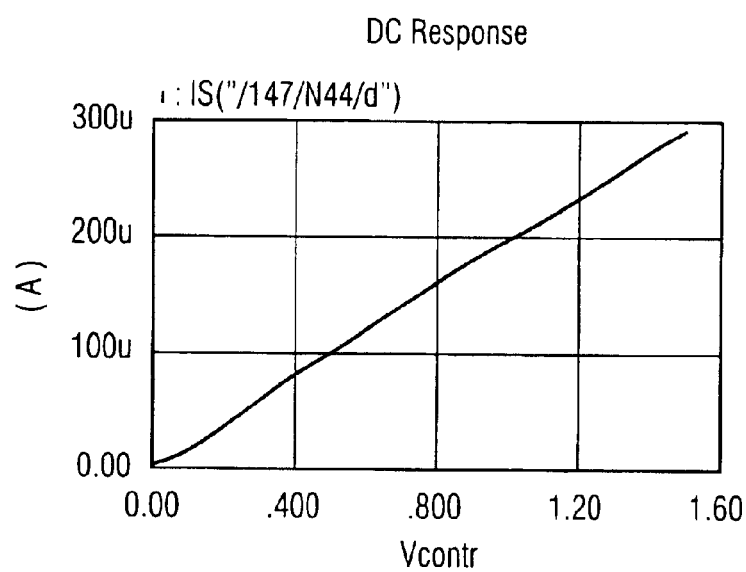
FIGS. 5(a) and 5(b) show the characteristics of the voltage-to-current converters of FIG. 3 and FIG. 4, respectively.
Figure 5B:
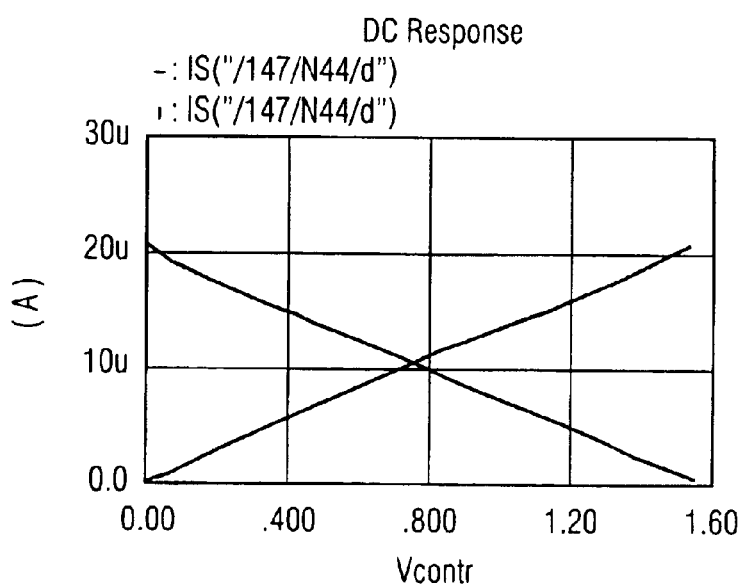
Figure 6A:
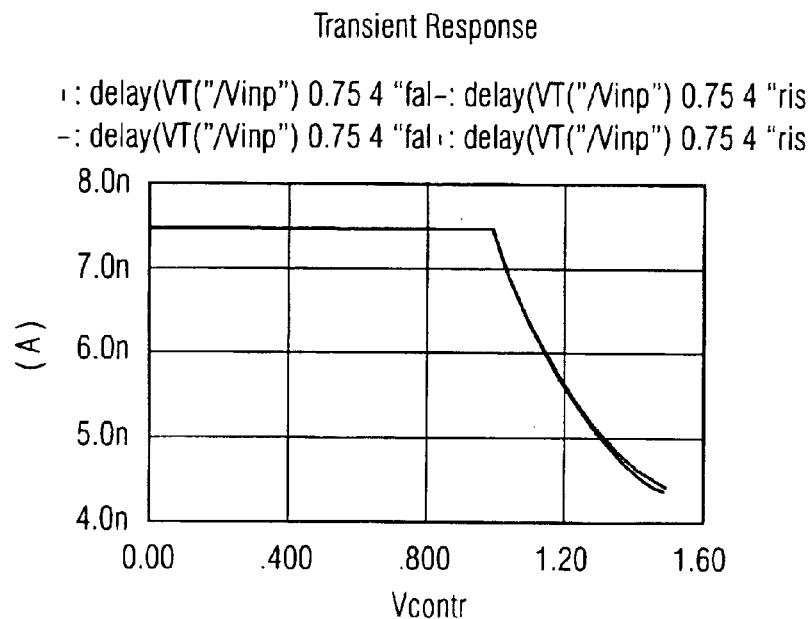
FIGS. 6(a) and 6(b) compare the delay characteristic of the VCDL of the present invention to the delay characteristic of a typical VCDL of the prior art.
Figure 6B:
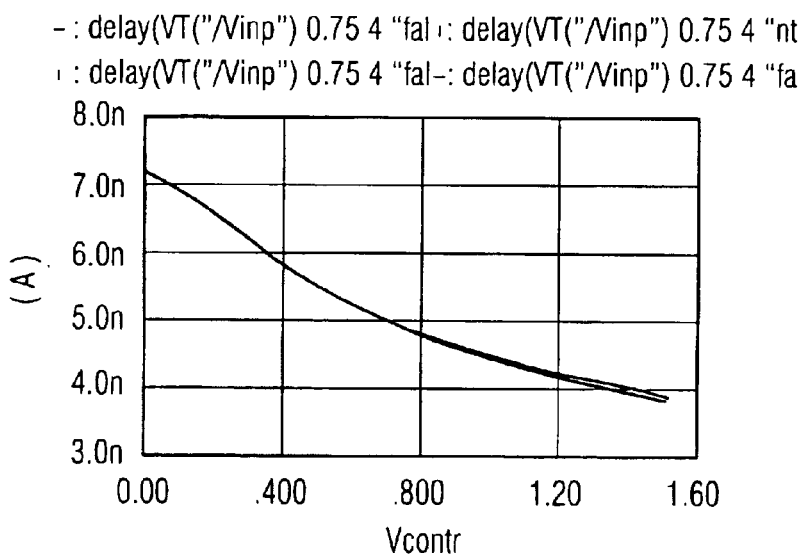
Figure 7B:
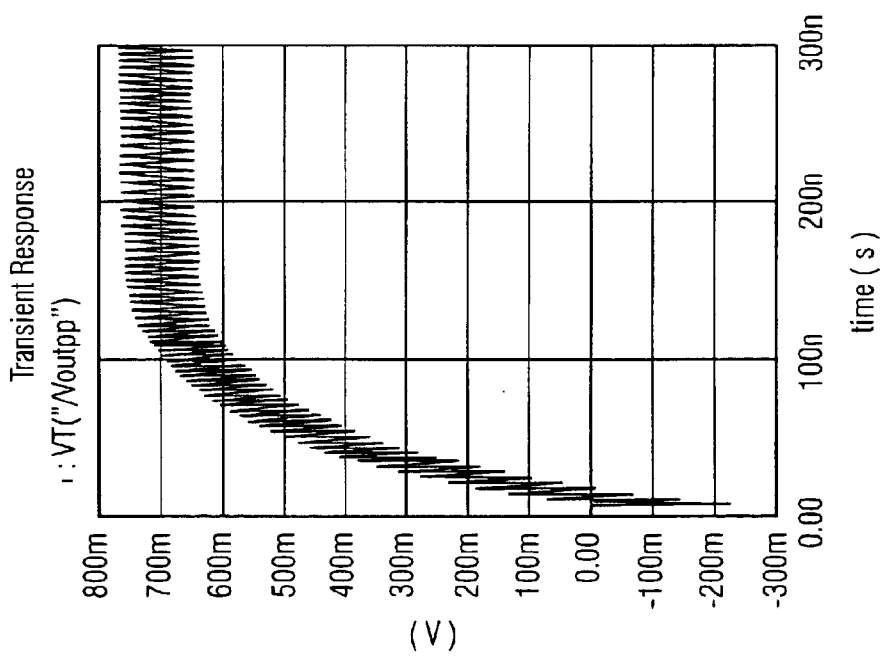
FIGS. 7(a) and 7(b) illustrate results of the duty cycle correction of the present invention.
Figure 7A:
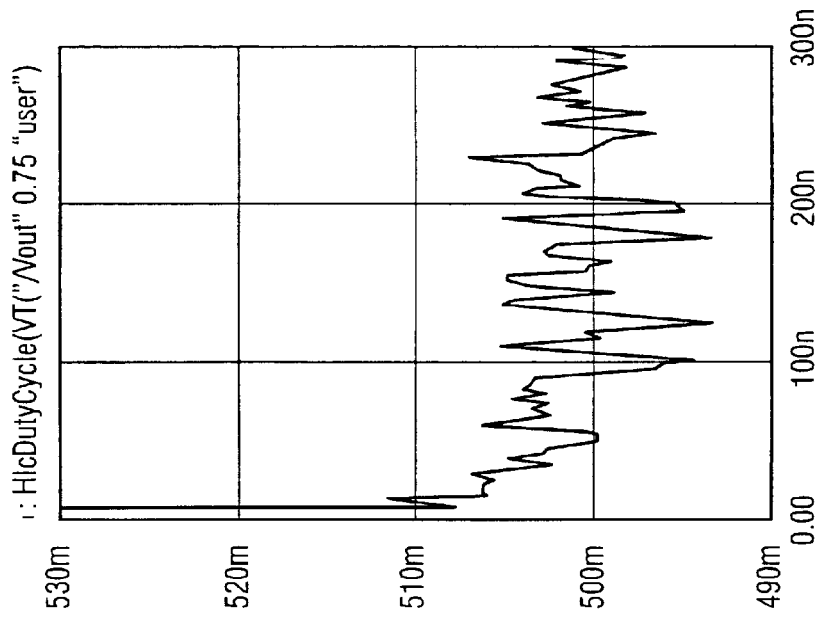

Computer simulations for the present invention were performed based on a VDD 31 value of 1.5 volts and using a 0.12 $\mu$ CMOS process. FIG. 5(a) shows the characteristic of the voltage-to-current converter 13 while FIG. 5(b) shows the characteristic of the differential outputs 69, 71 of the voltage-to-current converter 63 used by the duty cycle correction circuits 17, 18. FIG. 6 compares the delay characteristic of the VCDL of the present invention FIG. 6(b) to the delay characteristic of a typical VCDL of the prior art FIG. 6(a). It can be seen that the prior art only approximates a linear delay characteristic over a very limited range of the control voltage. On the other hand, the VCDL of the present invention is shown to have a substantially linear delay characteristic over the entire range of the control voltage. FIG. 7 illustrates the duty cycle correction of the present invention. FIG. 7(a) shows the transient voltage of the low pass filter 61 of the duty cycle correction circuits 17, 18. FIG. 7(b) shows the process of duty cycle correction when a 0.75 V control voltage is supplied to $V_{control}$ 33.

In the present invention, various combinations and variations of the linear delay producing and duty cycle correction parts of the invention can used alone or together. Thus, although the invention has been described above using particular embodiments, many variations are possible within the scope of the claims, as will be clear to a skilled reader.

I claim:

1. A voltage-controlled delay line comprising:
    a series of delay cells outputting a clock output signal having a delay relative to a clock input signal input to the series of delay cells;
    a duty-cycle correction section for correcting the duty cycle of the clock output signal;
    a control current input to the series of delay cells to control the amount of the delay;
    a voltage-to-current converter for converting a control voltage into the control current so that the delay changes substantially linearly as the control voltage changes; and
    wherein the duty-cycle correction section samples the clock output signal to feed duty-cycle correction signals back to the series of delay cells.

2. The voltage-controlled delay line of claim 1 wherein the series of delay cells have substantially linear delay characteristics over a range of the control current.

3. The voltage-controlled delay line of claim 2 wherein the voltage-to-current converter converts the control voltage into the control current over a range of the control current for which the delay cells have substantially linear delay characteristics.

4. The voltage-controlled delay line of claim 1 wherein the series of delay cells is comprised of differential inverter delay cells each having two clock inputs and two clock outputs.

5. The voltage-controlled delay line of claim 4 wherein the two clock outputs of a delay cell of the series of delay cells supplies the two clock inputs of another delay cell of the series of delay cells.

6. The voltage-controlled delay line of claim 4, wherein the duty-cycle correction section includes first and second duty cycle correction circuits with each circuit sampling a different one of the two clock outputs and providing feedback to substantially simultaneously charge and discharge current of the delay cells in opposite directions.

7. The voltage-controlled delay line of claim 6, further comprising first and second busses connecting the first and second duty cycle correction circuits to first and second current mirrors of the series of delay cells.

8. The voltage-controlled delay line of claim 1 further comprising a current adder for adding current to the control current to drive the series of delay cells.

9. The voltage-controlled delay line of claim 1 wherein the duty-cycle correction section includes a duty cycle correcting voltage-to-current converter.

10. The voltage-controlled delay line of claim 9 wherein the duty cycle correcting voltage-to-current converter has first and second current outputs, the first current output outputting a current which increases with increasing voltage sampled from one of the clock outputs and the second current output outputting a current which decreases with increasing voltage sampled from another of the clock outputs.

11. The voltage-controlled delay line of claim 1 wherein the duty-cycle correction section includes a charge pump, low pass filter and a duty cycle correcting voltage-to-current converter.

12. A delay locked loop utilizing voltage-controlled delay line of claim 1 to provide delay.

13. A method for providing linear delay relative to a control voltage compromising the steps of:

inputting an differential input clock signal into a series of delay cells;

inputting a control voltage into a voltage-to-current converter;

inputting a control current output from the voltage-to-current converter into the series of delay cells;

outputting a differential output clock voltage from the series of delay cells having a delay relative to the input clock voltage;

varying the control voltage to vary the delay by an amount substantially directly proportional to the amount the control voltage is varied and further comprising the steps of:

sampling the differential output clock voltage using first and second duty cycle correction circuits;

converting, in each of the first and second duty cycle correction circuits, the sampled voltages into a first duty cycle correcting current which increases with increasing sampled voltage and into a second duty cycle correcting current which decreases with increasing sampled voltage;

feeding the first and second duty cycle correcting currents from the duty cycle correction circuits to current mirrors in the series of delay cells to substantially simultaneously charge and discharge current of the series of delay cells in opposite directions to correct the duty cycle.

* * * * *